United States Patent
Koba

(10) Patent No.: US 6,351,515 B2
(45) Date of Patent: Feb. 26, 2002

(54) HIGH CONTRAST RATIO MEMBRANE MASK

(75) Inventor: Fumihiro Koba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/837,848

(22) Filed: Apr. 18, 2001

(30) Foreign Application Priority Data

Apr. 20, 2000 (JP) .............................. 12-118908

(51) Int. Cl.⁷ .................................. G21K 5/00
(52) U.S. Cl. ............................ 378/35; 378/34
(58) Field of Search ................ 378/35, 205, 34; 430/5, 296

(56) References Cited

U.S. PATENT DOCUMENTS 4,698,285 A * 10/1987 Ehnfeld et al. ............ 430/5
6,168,890 B1 * 1/2001 Takahashi ................ 430/5
6,212,252 B1 * 4/2001 Kise et al. .............. 378/35
6,287,731 B1 * 9/2001 Katakura ................ 430/5

* cited by examiner

Primary Examiner—Robert H. Kim
Assistant Examiner—Irakli Kiknadze
(74) Attorney, Agent, or Firm—Rosenman & Colin LLP

(57) ABSTRACT

A membrane mask for use in an electron beam lighography or X-ray lighography has a membrane film formed on a silicon wafer, and a mask body pattern formed on the membrane film. The membrane film has a heavy-metal-implanted area underlying a portion of the mask body pattern other than the opening of the mask body pattern. The implanted area achieves a higher contrast ratio in the pattern obtained from the membrane mask.

12 Claims, 4 Drawing Sheets

HIGH CONTRAST RATIO MEMBRANE MASK

BACKGROUND OF THE INVENTION (a) Field of the Invention

The present invention relates to a high contrast ratio membrane mask and, more particularly, to a membrane mask for use in an electron beam lithography or an X-ray lithography. The present invention also relates to a method for forming such a membrane mask.

(b) Description of the Related Art

A membrane mask is used in an electron beam lithography and an X-ray lithography during a fabrication process for fabricating a semiconductor device. The membrane mask generally includes a mask body pattern used as a scattering film for scattering electron beams or an absorbing film for absorbing X-rays, a membrane film for supporting the mask body pattern, and a silicon substrate for supporting the membrane film.

A conventional technique for forming a membrane mask will be described first with reference to FIGS. 1A to 1C. A boron nitride film 42 having a thickness of 3 μm is deposited on a silicon wafer 41 by a CVD technique, followed by deposition of a tungsten film 43 thereon by using a high-frequency sputtering technique, as shown in FIG. 1A. The tungsten film 43 has a thickness around 1.5 μm and has a mixed-phase crystal structure including an α phase and β phase.

Subsequently, as shown in FIG. 1B, a resist film 44 for an electron beam exposure is applied thereon by spin-coating, followed by exposure of an electron beam 45 to write a desired pattern on the resist film 44.

Thereafter, as shown in FIG. 1C, the resist film 44 is developed to form an electron beam mask having a desired pattern. Then, as shown in FIG. 1D, the tungsten film 43 is subjected to a reactive ion etching (RIE) process using the resist film 44 as a mask to obtain a membrane mask having the desired pattern.

In the conventional process as described above, it is known that the mixed-phase crystal structure of the tungsten film 43 including the α phase and the β phase affords a smaller internal stress of the tungsten film 43. The smaller internal stress allows the membrane mask to have a lower distortion in the mask pattern if the membrane mask has a larger thickness for achieving a higher contrast ratio.

Recently, it is desired that the membrane mask have a higher patterning accuracy as well as a higher locational accuracy in view of the rapid development of the finer design rule in a semiconductor device. It is known that the tungsten film has a large internal stress due to the specific property of the tungsten film known in the heavy metals. The large internal stress causes a film distortion to thereby prevent the patterning accuracy and incurring peeling-off in the membrane mask. The patterning accuracy or prevention of the peeling-off may be achieved by a larger thickness of the tungsten film used as the electron beam scattering film or the X-ray absorbing film.

The larger thickness of the mask body pattern, however, increases the aspect ratio of the mask body pattern, which degrades the patterning accuracy of the mask body film. The aspect ratio is generally defined by a ratio of the film thickness to the width of the pattern on the mask film.

In the conventional technique shown in FIGS. 1A to 1D, the mixed-phase crystal structure of the tungsten film including the α phase and the β phase may reduce the film stress, whereby the thickness of the mask body may be reduced. However, the specified contrast ratio desired for the membrane mask prevents the reduction of the film thickness. Thus, the patterning accuracy of the mask body is not achieved in the conventional technique.

SUMMARY OF THE INVENTION

In view of the above, it is an object of the present invention to provide a membrane mask having a smaller thickness without degrading the contrast ratio and thus achieving a higher patterning accuracy.

It is also an object of the present invention to provide a method for forming such a membrane mask.

The present invention provides a membrane mask including a wafer, a membrane film including a first material and supported by the wafer, and a mask body overlying the membrane film, the mask body having a mask pattern including an opening, the membrane film having a first area underlying the mask body other than the opening, the first area being formed by addition of atoms having an atomic number higher than an atomic number of the first material.

The present invention also provides a method for forming a membrane mask including the steps of: forming a membrane film supported on a wafer; forming a resist mask on the membrane film; selectively implanting atoms into the membrane film by using the resist mask to form an implanted area, the atoms having an atomic number higher than an atomic number of a material included in the membrane film; forming a mask body film on the membrane film including the implanted area; and patterning the mask body film to have a pattern including an opening exposing the membrane film other than the implanted area.

In accordance with the membrane mask of the present invention and the membrane mask formed by the method of the present invention, the implanted area including the atoms having a higher atomic number has a function of electron beam scattering or X-ray absorbing, thereby assisting the mask body. The implanted area thus improves the contrast ratio of the resultant pattern obtained by the mask body pattern without increasing the thickness of the mask body.

The above and other objects, features and advantages of the present invention will be more apparent from the following description, referring to the accompanying drawings.

PREFERRED EMBODIMENTS OF THE INVENTION

Figure 1A:
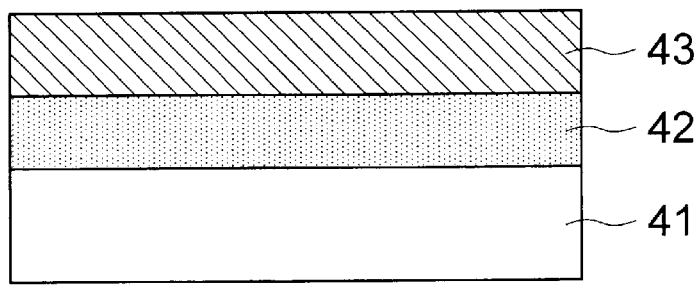
FIGS. 1A to 1D are sectional views of a conventional membrane mask, consecutively showing the fabrication steps therefor.
Figure 1B:
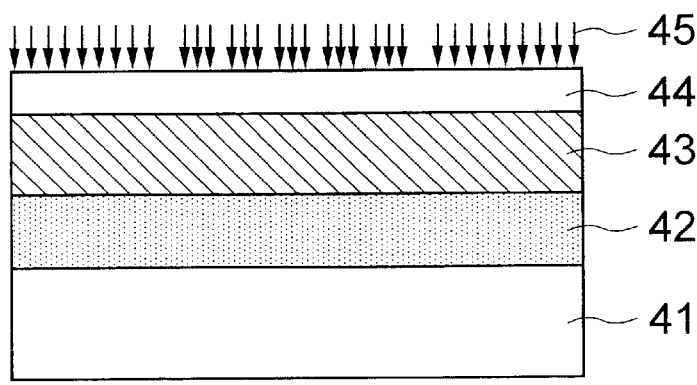
Figure 1C:
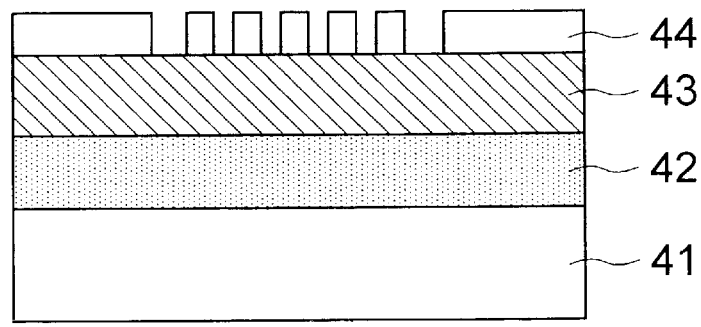
Figure 1D:
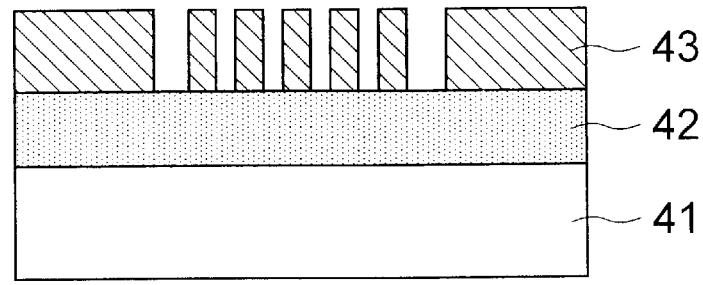
Figure 2:
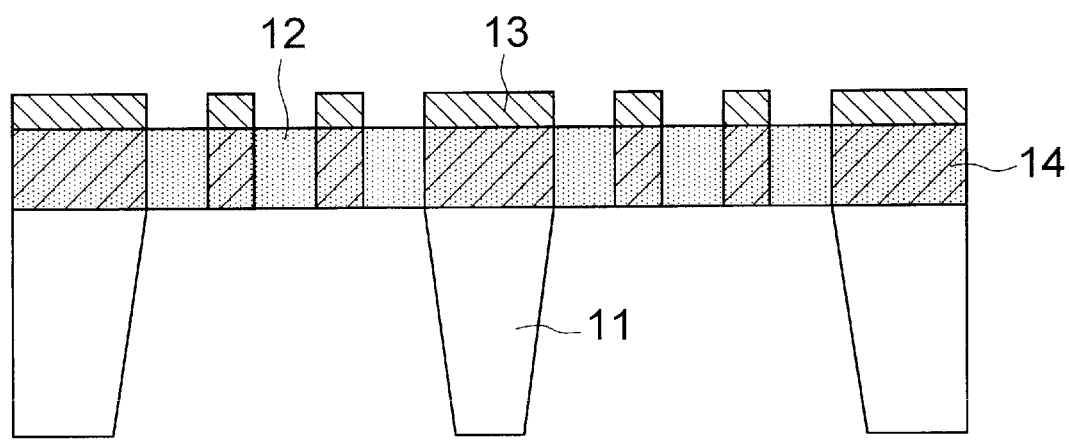
FIG. 2 is a sectional view of a membrane mask according to an embodiment of the present invention.

Referring to FIG. 2, a membrane mask according to an embodiment of the present invention includes a silicon wafer 11, a membrane film 12 formed thereon and implemented by a first material having a relatively low atomic number, and a mask body pattern 13 formed thereon and implemented by a second material having a relatively high atomic number.

The membrane film 12 has an implanted area 14 at the bottom of the mask body pattern 13 except for the opening in the mask body pattern 13. The implanted area 14 is formed by implanting or adding heavy atoms having an atomic number higher than the atomic number of the first material to the membrane film 12. The heavy atoms in the implanted area 14 have a function of scattering electron beams or absorbing X-rays in association with the mask body pattern 13. The area of the membrane film 12 other than the implanted area 14 has an inherent function for suitably passing therethrough electron beams or X-rays due to the absence of the heavy atoms therein.

Examples of the first material in the membrane film 12 include silicon nitride (SiN), silicon carbide (SiC), boron nitride (BN), diamond (C) etc. The heavy atoms in the implanted area 14 of the membrane film 12 may be preferably selected from heavy metals, and more preferably selected from the heavy metals tabulated on he periodic table at the sixth period and the subsequent periods. Examples of the heavy metals include tungsten (W), tantalum (Ta), gold (Au), platinum (Pt), lead (Pb) etc. The implanted heavy atoms may include a plurality of heavy metals.

The material for the mask body pattern 13 may be preferably selected from heavy metals or heavy alloys such as W. Ta, TaGe, TaReGe. The mask body pattern 13 may preferably include one or more of the heavy metals tabulated on the periodic table at the sixth period and the subsequent periods.

Figure 3A:
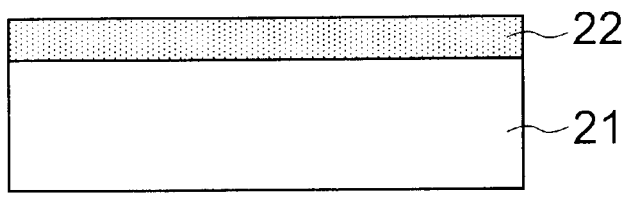
FIGS. 3A to 3F are sectional views of the membrane mask of FIG. 2, consecutively showing the steps of a fabrication process therefor.

Referring to FIGS. 3A to 3F, there is shown a fabrication process for fabricating a membrane mask according to an embodiment of the present invention. The membrane mask is used for an electron beam lithography, for example. In FIG. 3A, a silicon nitride film (SiN) 22 is deposited on the top surface of a silicon wafer 21 having a diameter of 200 mm by using a LPCVD (low pressure chemical vapor deposition) technique to a thickness of 100 nm (nanometers). It is to be noted that the thickness of the silicon nitride film 22 is preferably 150 nm or less.

Figure 3B:
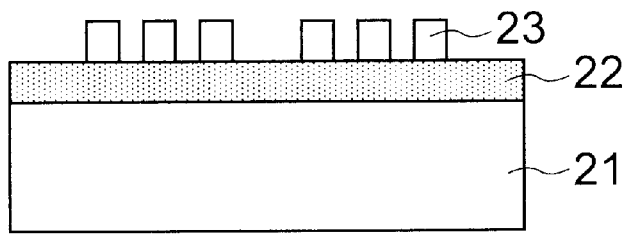

Subsequently, the silicon nitride film 22 is spin-coated with resin to form a resin film thereon, followed by patterning thereof using an electron beam lithographic technique to form a resist pattern 23, as shown in FIG. 3B. The resist pattern 23 has openings therein for implanted areas to be formed for scattering the electron beams.

Figure 3C:
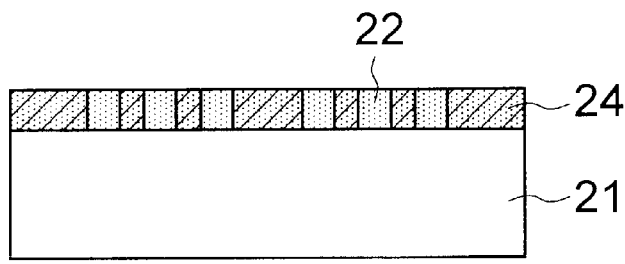

Thereafter, heavy metal ions such as tungsten or chrome ions are implanted into the silicon nitride film 22 by using a resist pattern 23 as a mask, thereby forming a heavy-metal-implanted area 24. The resist pattern 23 is then removed, as shown in FIG. 3C.

Figure 3D:
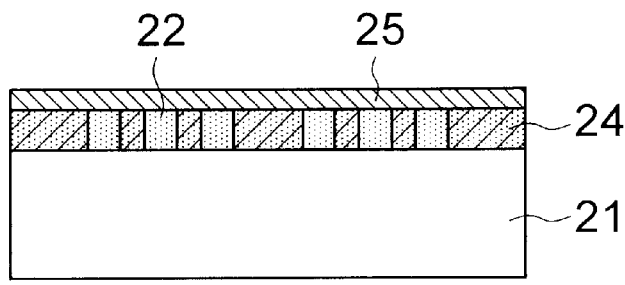

A tungsten film 25 is deposited on the silicon nitride film 22 including the heavy-metal-implanted area 24 by using a sputtering or LPCVD technique to a thickness of about 10 nm, as shown in FIG. 3D. It is to be noted that the thickness of the tungsten film 25 is preferably 20 nm or less.

Figure 3E:
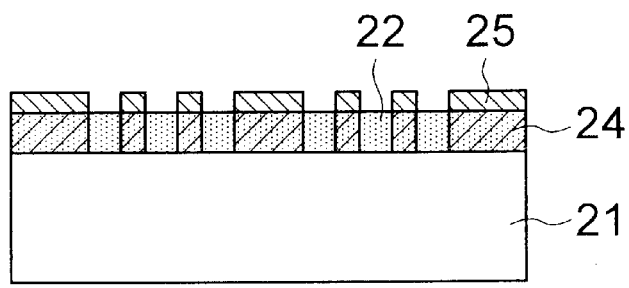

Subsequently, the tungsten film 25 is spin-coated with resist to form a resist film thereon, followed by an electron is beam lithography thereof to form a resist pattern. The underlying tungsten film 25 is then selectively etched by using a dry-etching technique using the resist pattern, as shown in FIG. 3E.

Figure 3F:
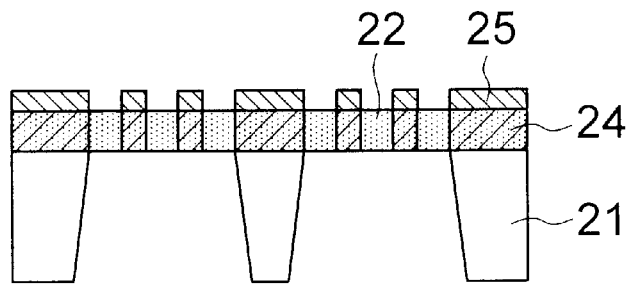

Thereafter, a mask pattern is formed on the bottom surface of the silicon wafer 21, followed by anisotropic back etching of the silicon wafer 21 by a wet etching technique using potassium hydroxide (KOH) as an etchant and the silicon nitride film 22 as an etch stopper Thus, the silicon nitride film 22 is formed as a membrane film having an implanted area 24, as shown in FIG. 3F. The wet etching step may be replaced by a dry etching step.

Figure 4A:
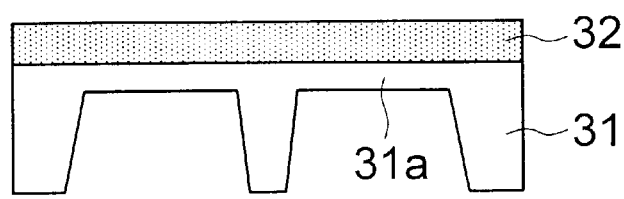
FIGS. 4A to 4F are sectional views of the membrane mask of FIG. 2, consecutively showing the steps of another fabrication process therefor.

Referring to FIGS. 4A to 4F, there is shown another fabrication process for fabricating the membrane mask of FIG. 2 according to another embodiment. The membrane mask is used for an electron beam lithography, for example. A silicon nitride film 32 is deposited to a thickness of 130 nm by using a LPCVD technique on the top surface of a silicon wafer 32 having a diameter of 200 mm. A mask having a specified opening is then formed on the bottom surface of the silicon wafer 31, followed by back etching of the silicon wafer 31 by a wet etching technique using KOH as an etchant, to thereby leave a film of the silicon wafer 31 having a thickness of 0.1 to 1 mm and underlying the silicon nitride film 32, as shown in FIG. 4A.

Figure 4B:
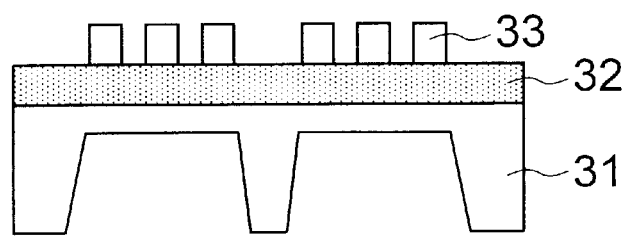
Figure 4C:
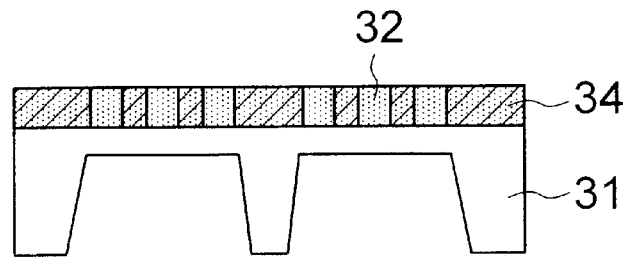

The silicon nitride film 32 is then spin-coated with resist to form a resist film thereon, followed by patterning thereof to form a resist pattern 33, as shown in FIG. 4B. Subsequently, tungsten ions are selectively implanted into the silicon nitride film 32 by using the resist pattern 33 as a mask to form a heavy-metal-implanted area 34. The resist pattern 33 is then removed, as shown in FIG. 4C. The order of the steps may be reversed so that the back etching step of the silicon wafer 31 is conducted after the implanting of the tungsten ions.

Figure 4D:
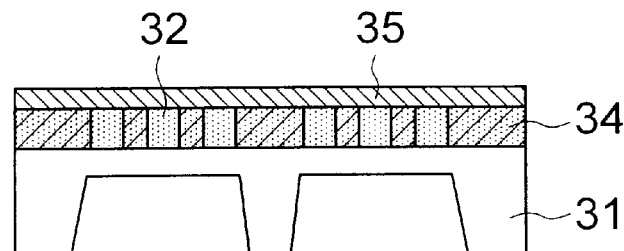
Figure 4E:
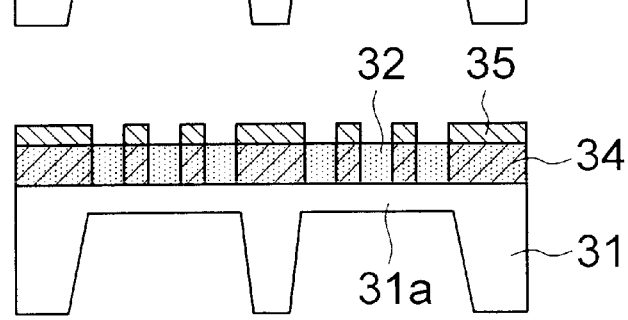

Thereafter, tungsten is sputtered onto the silicon nitride film 32 including the heavy-metal-implanted area 34, thereby forming a tungsten film 35 having a thickness of 15 nm, as shown in FIG. 4D. The tungsten film 35 is subjected to an electron beam lithographic patterning, whereby a portion of the tungsten film 35 is left on the heavy-metal-implanted area 34, as shown in FIG. 4E.

Figure 4F:
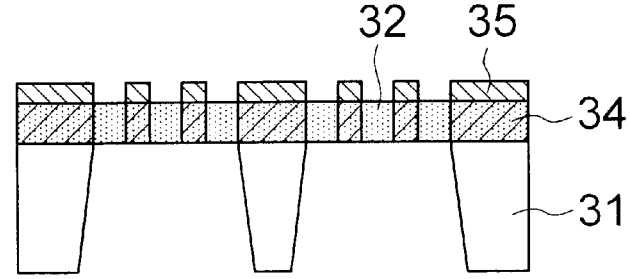

Subsequently, the remaining film 31a of the silicon wafer 31 is removed by a back etching, whereby the silicon nitride film 32 is disposed as a membrane film, as shown in FIG. 4F. The final back etching step may be an isotropic etching step wherein an etching mask is not necessarily used.

In the first fabrication process, there is a possibility that the silicon wafer may be subjected to a deformation due to a tensile stress applied from the membrane film after the back etching of the silicon wafer. On the other hand, in the second fabrication process, the tensile stress of the membrane film is removed to some extent before the film for the mask body is formed. In this process, the distortion of the silicon wafer after the back etching of the silicon wafer can be alleviated, whereby the membrane mask has a lower deformation.

Since the above embodiments are described only for examples, the present invention is not limited to the above embodiments and various modifications or alterations can be easily made therefrom by those skilled in the art without departing from the scope of the present invention.

For example, the back etching of the silicon wafer may be conducted before the deposition of the mask body film, such as before or after the implantation of the heavy metal ions. In addition, the membrane mask of the present invention can be applied to an X-ray lithography and an ion beam lithography as well as an electron beam lithography.

What is claimed is:

1. A membrane mask comprising wafer, a membrane film including a first material and supported by said wafer, and a mask body overlying said membrane film, said mask body having a mask pattern including an opening, said membrane film having a first area underlying said mask body other than said opening, said first area being formed by addition of atoms having an atomic number higher than an atomic number of said first material.

2. The membrane mask as defined in claim 1, wherein said first material is selected from the group consisting of SiN, SiC, BN, and diamond.

3. The membrane mask as defined in claim 1, wherein said atoms include a heavy metal.

4. The membrane mask as defined in claim 3, wherein said heavy metal is tabulated on a periodic table at a sixth period or one of subsequent periods.

5. The membrane mask as defined in claim 1, said mask body has a thickness of 20 nanometers or below.

6. The membrane mask as defined in claim 1, wherein said membrane film has a thickness of 150 nanometers or below.

7. A method for fabricating a membrane mask comprising the steps of:

forming a membrane film supported on a wafer;

forming a resist mask on said membrane film;

selectively implanting atoms into said membrane film by using said resist mask to form an implanted area, said atoms having an atomic number higher than an atomic number of a material included in said membrane film;

forming a mask body film on said membrane film including said implanted area; and patterning said mask body film to have a pattern including an opening exposing said membrane film other than said implanted area.

8. The method as defined in claim 7 further comprising, after said patterning step, the step of etching said wafer at a bottom surface thereof to expose said membrane film.

9. The method as defined in claim 7 further comprising, between said membrane film forming step and said resist mask forming step, the step of etching said wafer at a bottom surface thereof to expose said membrane film.

10. The method as defined in claim 7 further comprising, between said selectively implanting step and said mask body forming step, the step of etching said wafer at a bottom surface thereof to expose said membrane film.

11. The method as defined in claim 7 further comprising: the step of etching a bottom portion of said wafer so that said membrane film is not exposed, between said membrane film forming step and said resist mask forming step; and the step of etching a remaining portion of said wafer to expose said membrane film after said mask body film patterning step.

12. The method as defined in claim 7 further comprising: the step of etching a bottom portion of said wafer so that said membrane film is not exposed, between said selectively implanting step and said mask body film forming step; and the step of etching a remaining portion of said wafer to expose said membrane film after said mask body film patterning step.

* * * * *